(12) United States Patent
Takeno

(10) Patent No.: US 6,844,551 B2
(45) Date of Patent: Jan. 18, 2005

(54) METHOD OF DETERMINING LATTICE CONSTANT, METHOD OF EVALUATING MATERIAL BY USING THE SAME AND ELECTRONIC MICROSCOPE SUITABLE FOR USING THE SAME

(75) Inventor: Shiro Takeno, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/651,943

(22) Filed: Sep. 2, 2003

(65) Prior Publication Data

US 2004/0094714 A1 May 20, 2004

(30) Foreign Application Priority Data

Aug. 30, 2002 (JP) ..................... 2002-253647

(51) Int. Cl.[7] ........................... G01N 23/20
(52) U.S. Cl. ................. 250/311; 250/306; 250/310
(58) Field of Search .............................. 250/311, 307, 250/306, 310; 430/5

(56) References Cited

U.S. PATENT DOCUMENTS

| | | | | |
|---|---|---|---|---|
| 6,447,960 B2 | * | 9/2002 | Yamashita et al. | 430/5 |
| 6,593,153 B2 | * | 7/2003 | Matsuda et al. | 438/14 |
| 6,750,451 B2 | * | 6/2004 | Koguchi et al. | 250/311 |
| 2004/0075055 A1 | * | 4/2004 | Soeda | 250/311 |

FOREIGN PATENT DOCUMENTS

| | | |
|---|---|---|
| JP | 7-167719 | 7/1995 |
| JP | 10-162768 | 6/1998 |

OTHER PUBLICATIONS

David B. Williams, et al., "Lattice Parameter, Strain, and Composition Analysis", Transmission Electron Microscopy, Chp. 21.4, pp. 338 and 340.

* cited by examiner

Primary Examiner—John R. Lee
Assistant Examiner—Johnnie L Smith, II
(74) Attorney, Agent, or Firm—Oblon, Spivak, McClelland, Maier & Neustadt, P.C.

(57) ABSTRACT

The invention provides a method of determining a lattice constant of an arbitrary material such as a polycrystalline material speedily and easily, and a method of evaluating the stress and strain of the material speedily. According to the invention, the lattice constant of a standard sample is varied within a predetermined range and finds the HOLZ line pattern of the standard sample by calculation using an equation $(y=f(x, a)=\alpha(a)x+\beta(a))$ and the data of the pattern is accumulated to form a data library. On the other hand, a test sample to be measured is irradiated and scanned with a convergent electron beam. Then, a developing HOLZ line pattern is compared with the HOLZ line pattern in the data library and the most similar HOLZ line pattern is selected. From the data of the lattice constant of the data library having the most similar HOLZ line pattern, the lattice constant of the test sample to be measured is determined. Moreover, the distribution state of the stress and strain of the test sample to be measured can be two-dimensionally mapped by the use of the lattice constant determined in this manner.

9 Claims, 7 Drawing Sheets

$a = a_0 - 0.04$nm $a = a_0 + 0.04$nm a=0.5421nm a=0.5421nm a=0.5430nm

METHOD OF DETERMINING LATTICE CONSTANT, METHOD OF EVALUATING MATERIAL BY USING THE SAME AND ELECTRONIC MICROSCOPE SUITABLE FOR USING THE SAME

CROSSREFERENCE TO RELATED APPLICATION

This application is based upon and claims the benefit of priority from the prior Japanese Patent Application No. 2002-253647, filed on Aug. 30, 2002; the entire contents of which are incorporated herein by reference.

BACKGROUND OF THE INVENTION

1. Field of the Invention

The present invention relates to a method in which a material is irradiated with an electron beam to produce a higher order Laue zone line of a pattern unique to the material and in which a lattice constant is determined from this higher order Laue zone line, a method of evaluating strain and stress by the use of the method, and an electron microscope suitably used for the method.

2. Description of the Related Art

In general, among main methods of evaluating the state of strain and stress in a material are a strain gauge method, an X-ray diffraction method, a Raman spectroscopy, an FTM method (T. Ide et al., Jpn. J. Appl. Phys. Vol. 37(1998), L1546), and a convergent beam electron diffraction (CBED) method (M. Tanaka and M. Terauchi, Convergent Beam Electron Diffraction, JEOL, Tokyo, 1985). Of these analytical methods, only the CBED method can detect a change in a lattice constant not larger than $10^{-3}$ nm in an extremely microscopic region not larger than 10 nm. In particular, the state of stress and strain in an extremely microscopic region of about from 1 to 2 nm can be evaluated by the use of a field emission transmission electron microscope (FE-TEM).

In the development of a semiconductor device and the like, prime importance is placed on the evaluation of stress and strain by the CBED method because of an excellent spatial resolving power. In the CBED method, positions where a plurality of higher order Laue zone lines (HOLZ line) develop are correctly read and the lattice constant of a crystal is calculated from a positional relationship between the HOLZ lines thereby to valuate the stress and strain.

Then, an electron beam is easily entered into a single crystal such as a Si wafer from a specific crystal orientation and the lattice constant can comparatively easily calculated from the positional relationship between the HOLZ lines (for example, Stuer et al., J. Electrochem. Soc. Vol. 148 (2001), G597). However, in a case of evaluation of a polycrystal, the crystal orientations of respective crystal grains are not aligned in one direction, so that it is impossible even to align the incident directions of the electron beam. Against such a background, the evaluation of the polycrystal becomes such a work requiring an enormous amount of time and manpower that records the patterns of HOLZ lines unique to respective crystal grains and uniquely analyzes the patterns one by one to calculate lattice constants thereby to evaluate the stress and strain of each crystal grain.

Thus, in a case where the CBED method is applied to an actual polycrystalline material, a crystal grain having a specific crystal orientation is selected and only the selected crystal grain is evaluated (see Japanese Patent Application Laid-Open No. 7-286915 and the like). At present is required a method of analyzing a HOLZ line of an arbitrary crystal grain of various kinds of crystalline materials with an excellent spatial resolving power of about from 1 to 2 nm and speedily calculating its lattice constant.

That is, there has been conventionally presented a problem of speedily evaluating stress and strain existing in an arbitrary crystal grain existing in an arbitrary polycrystalline material with an excellent spatial resolving power of about from 1 to 2 nm.

SUMMARY OF THE INVENTION

The invention provides an electron microscope that irradiates a material with an electron beam to obtain a pattern of a higher order Laue zone line unique to the material and identifies a lattice constant from this higher order Laue zone line, a method of detecting a change in a lattice constant not larger than $10^{-3}$ nm by the use of the electron microscope and keeping a spatial resolving power of from 1 to 2 nm and evaluating stress and strain in an arbitrary crystal grain in an arbitrary polycrystalline material, and a method of mapping evaluation results on a two-dimensional monitor.

DETAILED DESCRIPTION OF THE PREFERRED EMBODIMENTS

Figure 1:
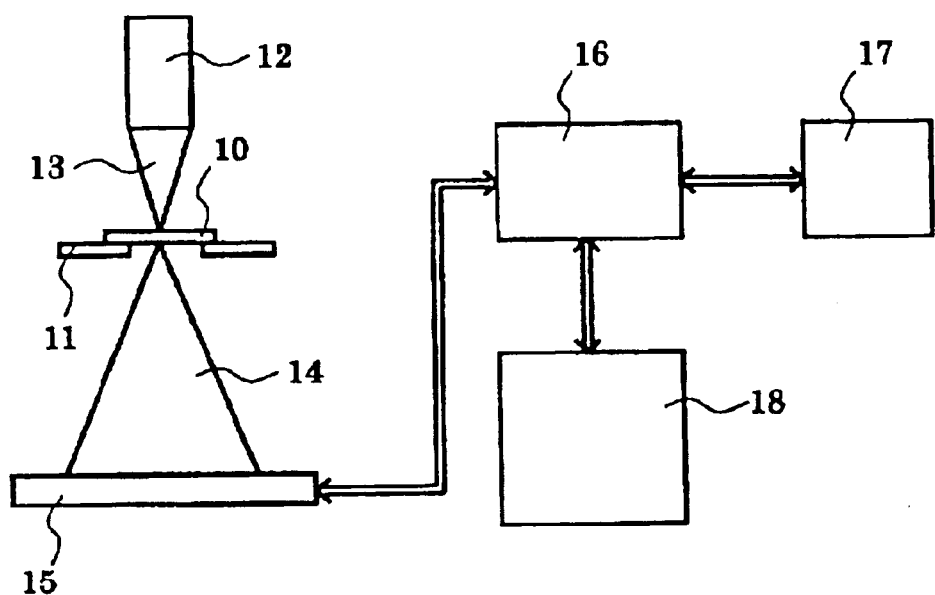
FIGS. 1 and 2 are schematic views of a lattice constant determining apparatus of the embodiment of the invention.

The above-mentioned invention has been completed on the basis of the following findings.

That is, in a case where it is assumed that a lattice constant at a room temperature (25° C.) of an arbitrary material is $a_0$, usually, a higher order Laue zone line (hereinafter referred to as "HOLZ line") pattern under an effective acceleration voltage can be fundamentally calculated by a kinetic diffraction theory (Tomokiyo et al.: Electron Microscopy, Vol. 24 (1989), 90).

First, a HOLZ line pattern for a lattice constant of $a_0+\Delta a$ in a crystal orientation of $[H_1K_1L_1]$ (hereinafter referred to as "pattern (+)") is calculated under a condition of an effective acceleration voltage. Next, a HOLZ line pattern for a lattice constant of $a_0-\Delta a$ in the same crystal orientation of $[H_1K_1L_1]$ (hereinafter referred to as "pattern (−)") is calculated. $\Delta a_0$ is an arbitrary microscopic change and is desirably set at one point in a range of 0.01 nm$\leq\Delta a\leq$0.05 nm, for example. A HOLZ line of an index hkl existing in the pattern (+) and the pattern (−) can be linearly approximated and expressed by the following equations (4) and (5) on an x-y plane.

$$y=f_{hkl}(x,\ a_0+\Delta a)=\alpha^{(+)}_{hkl}\cdot x+\beta^{(+)}_{hkl} \quad (4)$$

$$y=f_{hkl}(x,\ a_0-\Delta a)=\alpha^{(-)}_{hkl}\cdot x+\beta^{(-)}_{hkl} \quad (5)$$

Here, in a case where $\alpha^{(+)}_{hkl}>\alpha^{(-)}_{hkl}$ and $\beta^{(+)}_{hkl}>\beta^{(-)}_{hkl}$, assume that parameters S (equation (6)) and T (equation (7)) are expressed by the equations.

$$S_{hkl(1)}=(\alpha^{(+)}_{hkl}-\alpha^{(-)}_{hkl})/2\Delta a \quad (6)$$

$$T_{hkl(1)}=(\beta^{(+)}_{hkl}-\beta^{(-)}_{hkl})/2\Delta a \quad (7)$$

At that time, $\alpha_{hkl(1)}(a)$ and $\beta_{hkl(1)}(a)$ are set for an arbitrary lattice constant of "a" in the following equations (equation (8) and equation (9)).

$$\alpha_{hkl(1)}(a)=S_{hkl(1)}\cdot a+(\alpha^{(+)}_{hkl}+\alpha^{(-)}_{hkl}-2S_{hkl(1)}\cdot a_0)/2 \quad (8)$$

$$\beta_{hkl(1)}(a)=T_{hkl(1)}\cdot a+(\beta^{(+)}_{hkl}+\beta^{(-)}_{hkl}-2T_{hkl(1)}\cdot a_0)/2 \quad (9)$$

An arbitrary HOLZ line of an index hkl for the orientation of $[H_1K_1L_1]$ is expressed by the equation (10).

$$y=f_{hkl(1)}(x,a)=\alpha_{hkl(1)}(a)\cdot x+\beta_{hkl(1)}(a) \quad (10)$$

Similarly, in a case where a convergent electron beam is entered in an arbitrary orientation of $[H_nK_nL_n]$, an arbitrary HOLZ line of an index hkl for the arbitrary orientation of $[H_nK_nL_n]$ is expressed by the equation (11).

$$y=f_{hkl(n)}(x,a)=\alpha_{hkl(n)}(a)\cdot x+\beta_{hkl(n)}(a) \quad (11)$$

A lot of information of developing positions of the HOLZ lines expressed by these equations is stored as a set of data (data library) in a storage device. The storage device and the data library are connected to a scanning transmission electron microscope which is a convergent electron irradiation apparatus to make it possible to refer to the accumulated data. In this manner, the lattice constant of a material to be measured can be speedily determined.

An example of an electron microscope which is a lattice constant determining apparatus for use in the invention will be described with reference to FIG. 1.

In FIG. 1, reference numeral 10 denotes a test sample of a Si polycrystal or the like, and the test sample 10 is placed on a sample base 11. Then, the surface of this test sample 11 is irradiated with a convergent electron beam 13 from convergent electron beam irradiation means 12. The electron beam 13 entering the test sample 10 is diffracted by the test sample, thereby being emitted as an electron beam 14. This emitted electron beam 14 forms an image on an image forming unit 15 provided with an imaging device such as a CCD device and a HOLZ line pattern is observed. The HOLZ line pattern formed on the image forming unit 15 is converted into an electric signal by this image forming unit 15, is processed by a processing unit 16 such as a computer and is stored in a storage device 17. At this time, the HOLZ line pattern may be recorded as image information or may be also converted into and recorded in numerical information such as vector information. Further, a display device 18 such as a monitor capable of displaying two-dimensional image information is connected to this processing unit 16, and the lattice constant data and the strain data or the stress data determined by the processing unit 16 can be two-dimensionally displayed.

The above-mentioned image forming unit 15 is used for forming an image of the electron beam diffracted by the test sample. In the image forming unit 15, an electron beam is applied to a photosensitive material such as a scintillator and an optical image emitted from the scintillator can be converted into data which can be processed as image information by the use of a photosensitive device such as a CCD by the processing unit 16.

Figure 2:
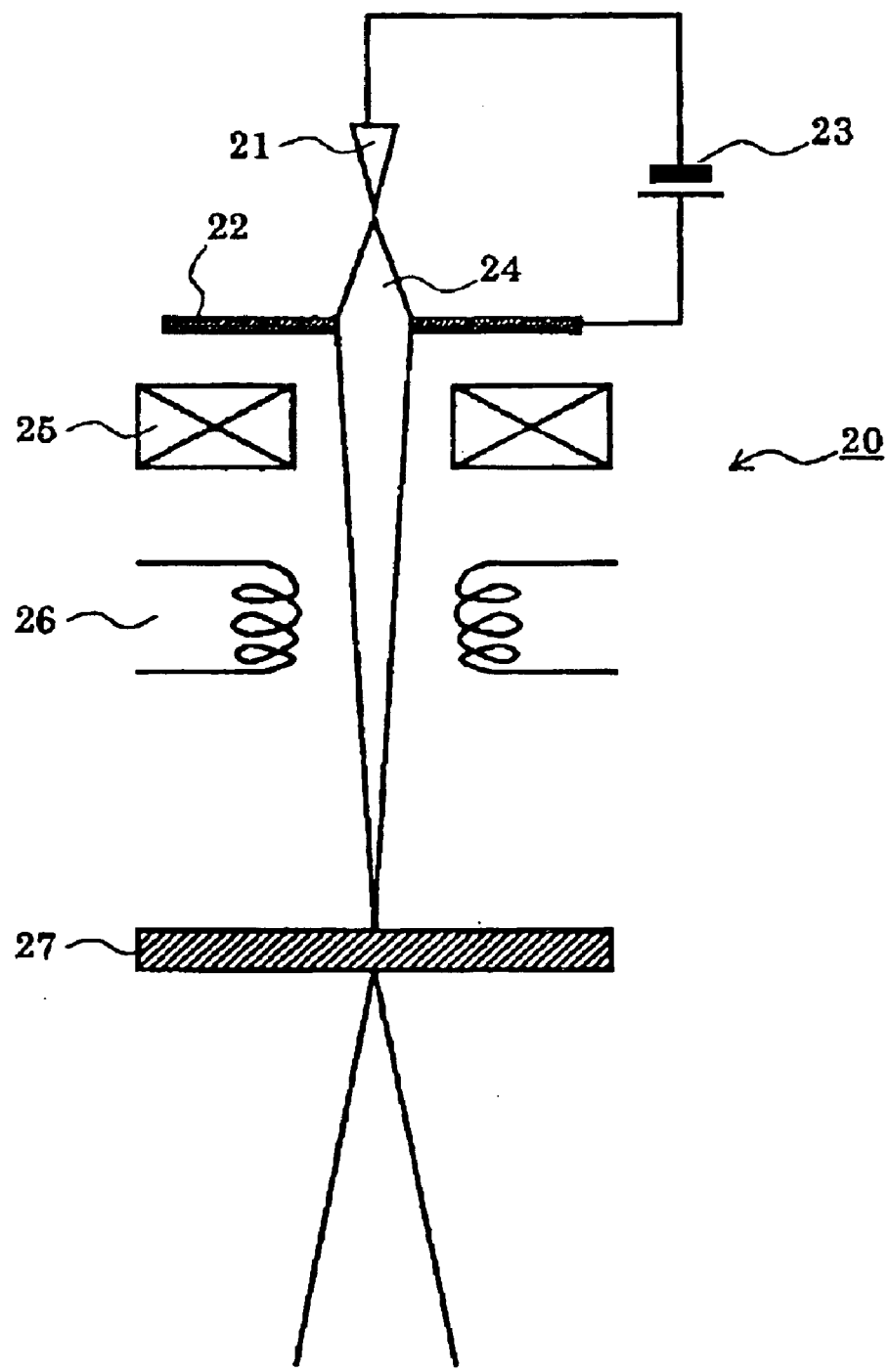

The above-mentioned electron microscope will be described in more detail by the use of FIG. 2 showing its main portion.

In FIG. 2, reference numeral 20 denotes a convergent electron beam irradiation apparatus of the electron microscope. This apparatus has an electron beam source 21 made of metal such as tungsten, an emitting and accelerating unit 22 for emitting and accelerating an electron beam 24 from this electron beam source 21, an probe forming lens 25 such as a solenoid coil for converging the electron beam 24, and an electron beam scanning coil 26 for scanning the surface of the test sample 27 such as a Si polycrystal with the emitted electron beam 24. Then, this apparatus applies an electric field across the electron beam source 21 and the emission and acceleration unit 22 by the use of a direct current to emit an electron beam.

Next, a method of determining the lattice constant of the test sample by the use of such a processing apparatus will be described with reference to FIG. 3 which is a conceptual view of the invention.

First, a standard sample 32 whose lattice constant is found is prepared and irradiated with a convergent electron beam 31 by the use of the apparatus shown in FIG. 1 and a HOLZ line pattern 35 is observed. This HOLZ line pattern is converted into an electric signal by the image forming unit 15 and is stored in the storage device 17 along with a known lattice constant. Then, the lattice constant of this standard sample is varied and the HOLZ line pattern corresponding thereto is calculated by the above-mentioned equation (11) and the calculated HOLZ line pattern is also stored in the storage device 17 together with the data of the standard sample. In this manner, a data library 37 is formed which includes the HOLZ line pattern of the standard sample, the HOLZ line patterns obtained by varying the lattice constant of the standard sample, and the lattice constant corresponding thereto. As the amount of data of the HOLZ line patterns and the lattice constants stored in this data library becomes larger, the accuracy of determining the lattice constant becomes higher.

Figure 3:
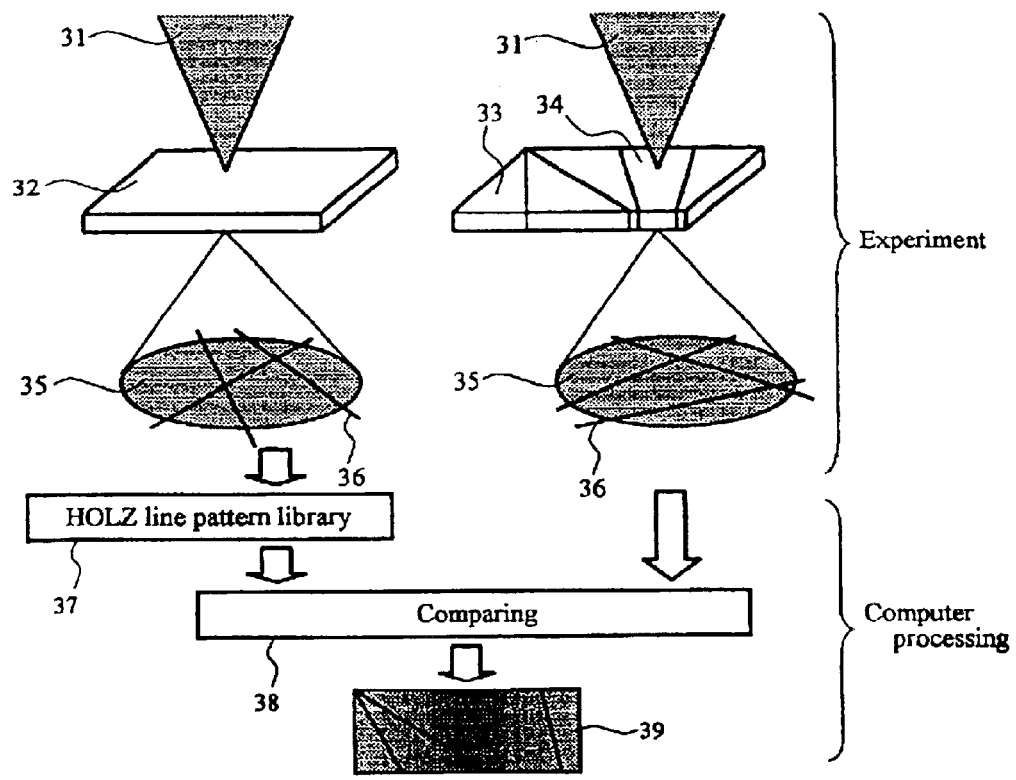
FIG. 3 shows the concept of a method of determining a lattice constant of the embodiment the invention.

Next, as shown in FIG. 3, a silicon polycrystal test sample 33 which is a test sample to be measured is placed on a sample base and the surface of the test sample to be measured is irradiated and scanned with the convergent electron beam 31 from the scanning transmission electron microscope to form an image on the surface of an image forming unit such as a CCD camera by an electron beam emitted from the test sample to be measured, whereby the HOLZ line pattern 35 of the test sample to be measured is continuously observed. At this time, the observed HOLZ line pattern 35 is continuously recorded in succession by the image forming unit while synchronized with the scanning of the convergent electron beam.

Next, the library 37 is searched for a HOLZ line pattern most similar to each image of individual HOLZ line patterns corresponding to a plurality of sample positions recorded in this manner and the lattice constant of the test sample to be measured is determined from the lattice constant stored in the library 37 in correspondence with the most similar HOLZ line pattern.

The same processing is performed in this manner to each of the HOLZ line patterns obtained and continuously recorded in correspondence with the surface positions of the test sample by scanning the surface positions of the test sample thereby to determine the lattice constants for all the patterns and the results are two-dimensionally displayed (mapped) on a display or the like. This maps a relationship of size between the lattice constants and is equivalent to a two-dimensional display of a strain distribution in the polycrystalline material. When this is converted into stress and again two-dimensionally displayed, a stress mapping in the polycrystalline material is obtained. As for a method of converting the strain into the stress, an elastic dynamics shown in "Introduction to Solid State Physics" authored by C. Kittlel (John Wiley & Sons, Inc., New York, 3rd edition, Chapter 4) can be used as a standard technology.

Next, one example of applying a material evaluation method of the invention to the evaluation of the stress and strain of the polycrsytal Si will hereinafter be described in detail.

Figure 4A:
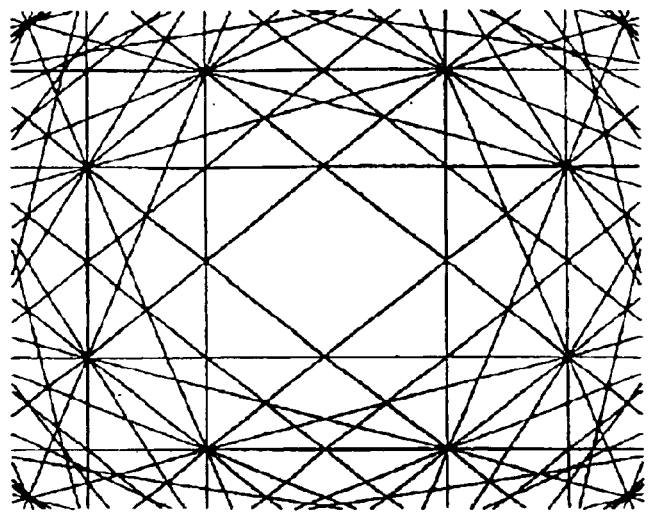
FIG. 4 shows such a calculation result of a HOLZ line pattern when a convergent electron beam is entered into a Si crystal from an orientation of [100] and $\Delta a=0.04$ nm that is obtained by the embodiment of the invention.
Figure 4B:
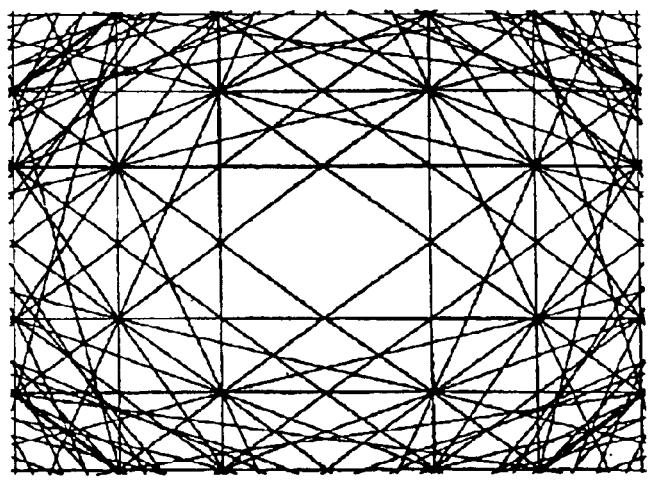
Figure 5:
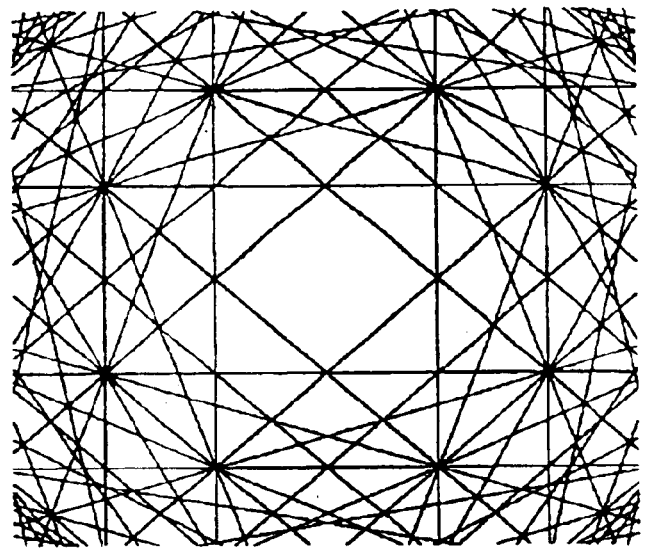
FIG. 5 shows such a calculation result of a HOLZ line pattern when a convergent electron beam is entered into a Si crystal from an orientation of [100] that is obtained by the embodiment of the invention.

First, it is assumed that the incident orientation $[H_1K_1L_1]$ of the convergent electron beam is [100]. HOLZ line patterns calculated for $\Delta a = 0.04$ nm according to the kinetic diffraction theory are shown in FIGS. 4A and 4B. FIG. 4A shows a calculation result in a case where the lattice constant is $a_0 - \Delta a$ and FIG. 4b shows a calculation result in a case where the lattice constant is $a_0 + \Delta a$ (where $a_0 = 0.5431$ nm). In this manner, a HOLZ line pattern for an arbitrary lattice constant of "a" when the incident orientation of the convergent electron beam is [100] can be determined by calculation. For example, the calculation result in a case where $a = 0.5421$ nm is shown in FIG. 5. Similarly, a HOLZ line pattern for an arbitrary lattice constant of "a" can be determined.

Figure 6:
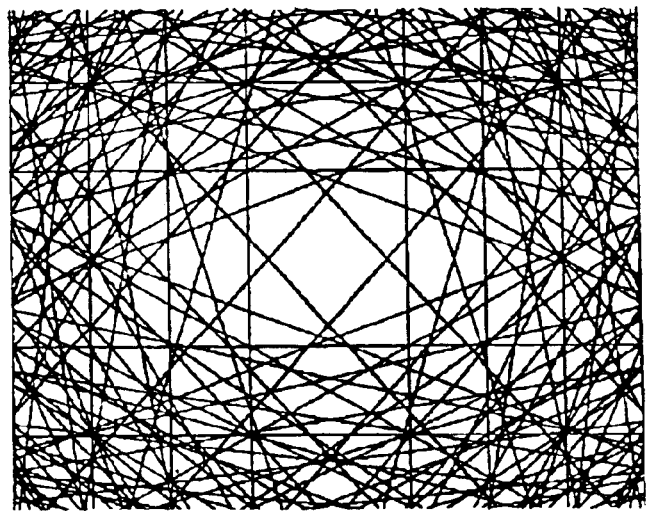
FIG. 6 shows a calculation result of a HOLZ line pattern when a convergent electron beam is entered into a Si crystal from an orientation of [110].

Next, in a case where $[H_2K_2L_2]=[110]$, similarly, HOLZ line patterns for a lattice constant of $a_0 + \Delta a$ and a lattice constant of $a_0 - \Delta a$ are determined by calculation and a HOLZ line pattern for an arbitrary lattice constant of "a" can be calculated. FIG. 6 show the calculation result of a HOLZ line pattern for $a = 0.5421$ nm when the incident orientation of the convergent electron beam is [110].

Figure 7:
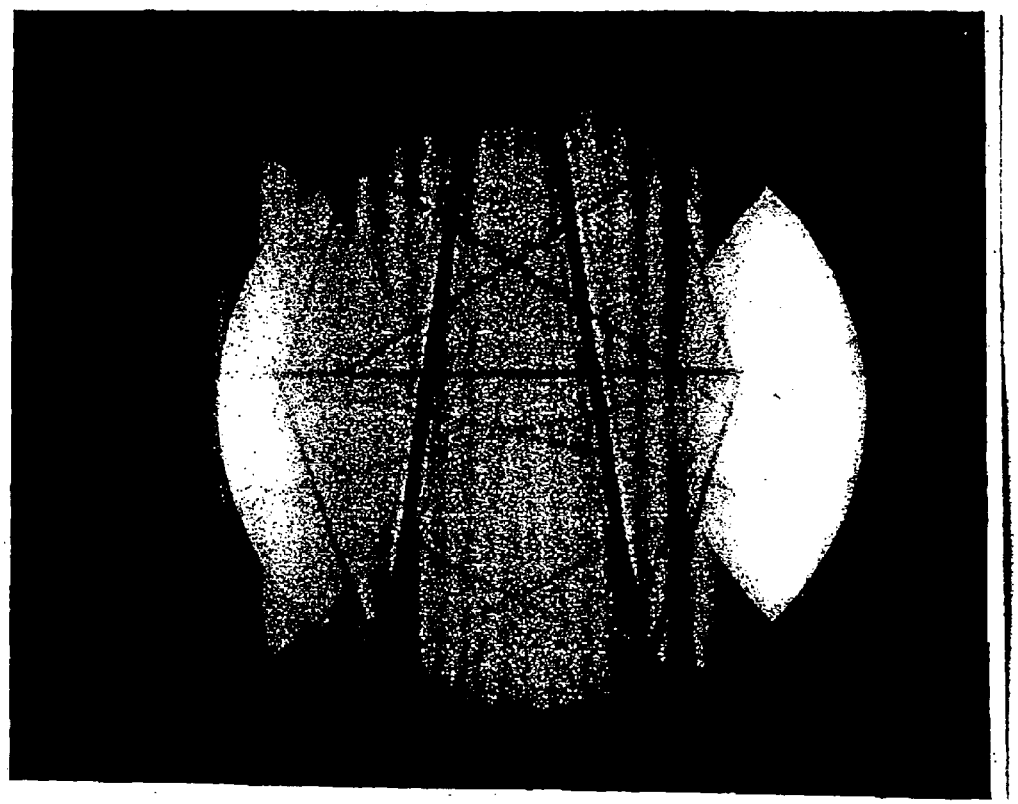
FIG. 7 shows an example of a HOLZ line pattern of a polycrystalline Si that is obtained by the embodiment of the invention.
Figure 8:
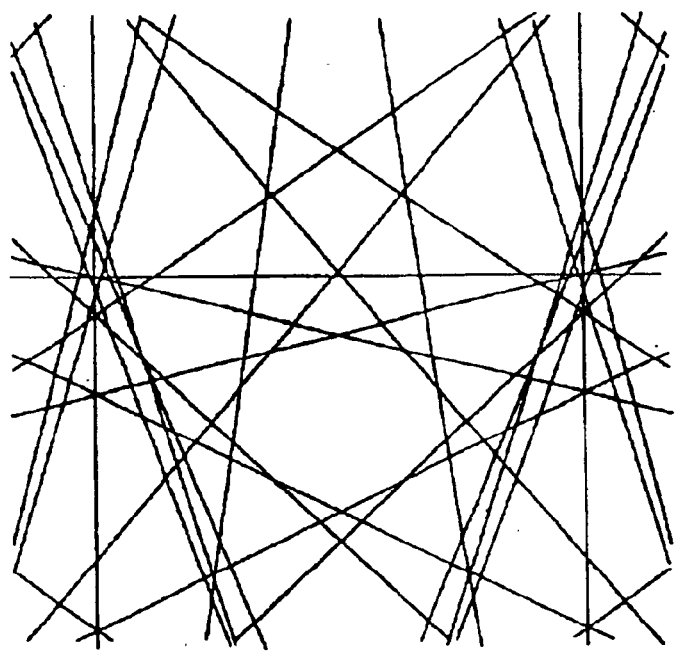
FIG. 8 shows such a HOLZ line pattern stored in a data library that is found to be in best agreement with the HOLZ line pattern obtained by the experiment in FIG. 7 by comparing the HOLZ line pattern obtained by the experiment in FIG. 7 with HOLZ line patterns stored in the data library by a computer.

In this manner, the HOLZ line pattern for an arbitrary incident orientation of $[H_nK_nL_n]$ is stored as a library. On the other hand, one HOLZ line pattern is shown in FIG. 7 which is obtained by making a convergent electron beam enter a polycrystal Si thin film. The above-mentioned library of the HOLZ line patterns is searched for a HOLZ line pattern in best agreement with the HOLZ line pattern shown in FIG. 7. As a result, a HOLZ line pattern for $[H_nK_nL_n]=[771]$ and $a = 0.5430$ nm is found to be in best agreement with the HOLZ line pattern shown in FIG. 7. FIG. 8 shows the HOLZ line pattern in best agreement with the HOLZ line pattern shown in FIG. 7. Thus, the lattice constant is found to be 0.5430 nm. Similarly, the lattice constants of all orientations of the Si crystal grain can be evaluated. These items of data can be converted into the stress and also be two-dimensionally mapped.

Here, in the invention, in the HOLZ line pattern obtained by irradiating the test sample with the convergent electron beam, the number of observed HOLZ lines is different, depending on the amount of energy of the convergent electron beam to be applied. Thus, it is necessary to make the amount of energy of the convergent electron beam applied to the standard sample for making a data library equal to the amount of energy of the convergent electron beam applied to the test sample to be measured.

Further, a well-known method such as pattern recognition can be used for comparing the HOLZ line pattern of the standard sample which is the data library with the HOLZ line pattern of the test sample to be measured.

As shown above, according to the invention, it is possible to evaluate a stress and strain distribution in an arbitrary polycrystal material with a spatial resolving power of from 1 to 2 nm. A method of evaluating stress and strain of a polycrystal with a high accuracy and with a high spatial resolving power in accordance with the invention can be applied to the development of a semiconductor device and various kinds of materials.

What is claimed is:

1. A method of measuring a lattice constant, the method comprising:

finding a general equation that expresses an arbitrary higher order Laue zone line on an x-y plane within a lattice constant range of $a_0 - \Delta a \leq a \leq a_0 + \Delta a$ (where "a" is a lattice constant) on the basis of pattern information of a higher order Laue zone line developing in a standard sample having a lattice constant of $a_0$, and calculating a pattern of a higher order Laue zone line in a case where the lattice constant is varied within the range of $a_0 - \Delta a \leq a \leq a_0 + \Delta a$ from the general equation, and storing the pattern of the higher order Laue zone line of the standard sample and its lattice constant and the pattern of the higher order Laue zone line of the standard sample and its lattice constant in a case where the lattice constant of the standard sample is varied as a set of data in a storage device; and comparing a pattern of a higher order Laue zone line observed on a test sample to be measured with the pattern of the higher order Laue zone line in the set of data stored in the storage device and determining a lattice constant of the test sample to be measured from the most similar lattice constant in the set of data.

2. The method of measuring a lattice constant according to claim 1, wherein the general equation is expressed by the following general equation (1) obtained from the following equations (2) and (3) obtained on the basis of the pattern of the higher order Laue zone line of the standard sample having a lattice constant of $a_0$:

$$y = f(x, a) = \alpha(a)x + \beta(a) \quad (1)$$

where $$\alpha(a) = Sa + (\alpha^{(+)} + \alpha^{(-)}) - 2Sa_0)/2 \quad (2)$$

$$\beta(a) = Ta + (\beta^{(+)} + \beta^{(-)}) - 2Ta_0)/2 \quad (3)$$

$$S = (\alpha^{(+)} - \alpha^{(-)})/2\Delta a$$

$$T = (\beta^{(+)} - \beta^{(-)})/2\Delta a$$

$$f(x, a_0 + \Delta a) = \alpha^{(+)}x + \beta^{(+)}$$

$$f(x, a_0 - \Delta a) = \alpha^{(-)}x + \beta^{(-)}.$$

3. The method of measuring a lattice constant according to claim 2, wherein a microscopic change of $\Delta a$ for varying the lattice constant of the test sample to be measured ranges from 0.01 nm or more and 0.05 nm or less.

4. The method of measuring a lattice constant according to claim 3, wherein the test sample to be measured is a polycrystal.

5. A method of evaluating a material, the method comprising:

finding a general equation that expresses an arbitrary higher order Laue zone line on an x-y plane within a lattice constant range of $a_0 - \Delta a \leq a \leq a_0 + \Delta a$ (where "a" is a lattice constant) on the basis of pattern information of a higher order Laue zone line developing in a standard sample having a lattice constant of $a_0$, and calculating a pattern of the higher order Laue zone line in a case where the lattice constant is varied within the range of $a_0 - \Delta a \leq a \leq a_0 + \Delta a$ from the general equation, and storing the pattern of the higher order Laue zone line of the standard sample and its lattice constant and the pattern of the higher order Laue zone line of the standard sample and its lattice constant in a case where the lattice constant of the standard sample is varied as a set of data in a storage device;

comparing a pattern of a higher order Laue zone line observed on a test sample to be measured with the pattern of the higher order Laue zone line in the set of data stored in the storage device and determining a lattice constant of the test sample to be measured from the most similar lattice constant in the set of data; and determining strain or stress of the test sample to be measured from the lattice constant determined in this manner.

6. The method of evaluating a material according to claim 5, wherein the test sample to be measured is a polycrystalline material, wherein stress or strain of a crystal constituting the polycrystalline material is determined, and the stress or strain of the polycrsytal determined in this manner is mapped on a two-dimensional monitor.

7. An electron microscope comprising at least an electron beam source, a probe forming lens, an electron beam scanning coil, a sample base, an image forming unit, a processing unit for processing an output image from the image forming unit, and a storage device for storing information processed by the processing unit, wherein the storage device stores a plurality of lattice constants of a standard sample and pattern information of a higher order Laue zone line of the standard sample, and the processing unit has a function of comparing a pattern of a higher order Laue zone line observed on a test sample to be measured with the plurality of patterns of the higher order Laue zone line of the standard sample stored in the storage device and determining a lattice constant of the test sample to be measured from the lattice constant of the standard sample corresponding to the most similar pattern of a higher order Laue zone line of the standard sample.

8. The electron microscope according to claim 7, wherein the image forming unit comprises a scintillator and an imaging device for forming an output optical image from the scintillator.

9. The electron microscope according to claim 8, wherein the imaging device is a CCD photosensitive device.

* * * * *